(12) United States Patent
Nikolsky et al.

(10) Patent No.: US 8,786,833 B2
(45) Date of Patent: Jul. 22, 2014

(54) LITHOGRAPHIC METHOD AND ARRANGEMENT FOR MANUFACTURING A SPACER

(75) Inventors: Pioter Nikolsky, Veldhoven (NL); Jozef Maria Finders, Veldhoven (NL); Remco Jochem Sebastiaan Groenendijk, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 431 days.

(21) Appl. No.: 12/760,983

(22) Filed: Apr. 15, 2010

(65) Prior Publication Data
US 2010/0310836 A1    Dec. 9, 2010

Related U.S. Application Data

(60) Provisional application No. 61/185,402, filed on Jun. 9, 2009.

(51) Int. Cl.
*G03B 27/32* (2006.01)
*G03B 27/52* (2006.01)

(52) U.S. Cl.
USPC .............................................. 355/77; 355/55

(58) Field of Classification Search
None
See application file for complete search history.

(56) References Cited

U.S. PATENT DOCUMENTS

| | | | |
|---|---|---|---|
| 6,383,952 B1 * | 5/2002 | Subramanian et al. | 438/781 |
| 6,483,580 B1 * | 11/2002 | Xu et al. | 356/300 |
| 7,046,331 B2 | 5/2006 | Rossing et al. | |
| 8,024,676 B2 * | 9/2011 | Carcasi et al. | 716/54 |
| 2003/0211297 A1 | 11/2003 | Rossing et al. | |
| 2009/0111281 A1 | 4/2009 | Bencher et al. | |

FOREIGN PATENT DOCUMENTS

| | | |
|---|---|---|
| CN | 1113605 | 12/1995 |
| CN | 1456940 | 11/2003 |
| JP | 2000-068509 | 3/2000 |
| JP | 2009-124134 | 6/2009 |
| WO | WO 2007058605 | * 5/2007 |

OTHER PUBLICATIONS

Chinese Office Action dated Mar. 21, 2012 in corresponding Chinese Patent Application No. 201010198859.X.
Japanese Office Action dated Feb. 21, 2012 in corresponding Japanese Patent Application No. 2010-127746.

* cited by examiner

*Primary Examiner* — Peter B Kim
*Assistant Examiner* — Michelle Iacoletti
(74) *Attorney, Agent, or Firm* — Pillsbury Winthrop Shaw Pittman LLP (57) ABSTRACT

A lithographic method includes exposing a first layer of material to a radiation beam to form a first pattern feature in the first layer, the first pattern feature having sidewalls, and a focal property of the radiation beam being controlled to control a sidewall angle of the sidewalls; providing a second layer of material over the first pattern feature to provide a coating on sidewalls of the first pattern; removing a portion of the second layer, leaving a coating of the second layer of material on sidewalls of the first pattern; removing the first pattern formed from the first layer, leaving on the substrate at least a part of the second layer that formed a coating on sidewalls of that first pattern, the part of the second layer left forming second pattern features in locations adjacent to the locations of sidewalls of the removed first pattern feature.

18 Claims, 7 Drawing Sheets

LITHOGRAPHIC METHOD AND ARRANGEMENT FOR MANUFACTURING A SPACER

CROSS REFERENCE TO RELATED APPLICATIONS

This application claims priority and benefit under 35 U.S.C. §119(e) to U.S. Provisional Patent Application No. 61/185,402, entitled "Lithographic Method and Arrangement", filed on Jun. 9, 2009. The content of that application is incorporated herein in its entirety by reference.

FIELD

The present invention relates to a lithographic method and arrangement. The lithographic arrangement may be, or may comprise, a lithographic apparatus as described below.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. including part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti-parallel to this direction.

The dimensions (e.g. line width, or critical dimension) of pattern features that can be applied to a substrate are limited by the wavelength of radiation which forms a radiation beam that is used to provide those features on the substrate. In order to decrease the minimum feature size, it is therefore possible to use radiation of a shorter wavelength. In practice, however, it is often technically difficult and expensive to reduce the wavelength to, for example, wavelengths in the extreme ultra-violet range of the electromagnetic spectrum in order to decrease the minimum feature size. Therefore, in order to reduce the feature sizes that can be applied to a substrate, different approaches have been investigated. One approach to reducing the feature sizes of patterns applied to a substrate is double patterning. Double patterning is a broad term which covers many techniques which are used to provide pattern features on a substrate which are, for example, dimensioned or spaced apart by distances which could not be achieved by using a single exposure and single development of a resist patterned by that exposure.

One example of double patterning is known as double exposure. Double exposure is a sequence of two separate exposures of the same layer of resist using two different masks (or the same mask that has been shifted in order to shift the target location of a pattern to be applied to the resist). The substrate and/or mask can be moved distances which are far smaller than the wavelength of the radiation used to expose the resist. In one example, the resist can be exposed to provide a first pattern. The substrate and/or mask can then be moved and a second exposure undertaken to provide a second pattern, ensuring that features of the second pattern are located in-between (e.g. interdigitated with respect to) features of the first pattern. The first pattern and second pattern are both, independently, subject to the same limits which are imposed on the minimum pattern feature size by the wavelength of radiation used in each exposure. However, because the pattern features of the combined first and second patterns are located in-between one another (e.g. interdigitated) the pattern features may be closer together than would have been achievable using only a single exposure. One problem with this approach, however, is that the first and second exposures have to be accurately aligned to ensure that the spacing between the pattern features (or, in other words, the overlay) in the resulted combined pattern is as desired. This can be difficult to reliably and consistently achieve.

Another approach is sometimes referred to as a spacer lithography process, or a self-aligned spacer process (as well as many other variations thereon). This process involves providing a first pattern feature (or more than one first pattern feature) on a substrate. The minimum dimensions of this first pattern feature are, as described above, subjected to the limit imposed by the wavelength of radiation used to provide the pattern feature. Material is then provided on the first pattern feature, coating sidewalls of the first pattern feature. The coatings on the sidewalls are known as spacers, giving this approach its name. The first pattern feature itself is then removed, but the material that was on the sidewalls remains. This material forms two second pattern features which are separated by the width of the original first pattern feature. Thus, two second pattern features are formed in place of a single first pattern feature—the second pattern features have, for example, approximately half the pitch of the original first pattern feature. The pitch is halved without having to decrease the wavelength of radiation used.

In a spacer lithography process, only a single exposure is undertaken, and so there is no need to consider the alignment or overlay requirements associated with the double exposure process discussed above. A different problem is, however, encountered in the spacer lithography process. For instance, it is desirable to ensure that the second pattern features have the same dimensions as each other (e.g. the same line width), and that the second pattern features are equally spaced with respect to one another, to ensure that a pattern provided on a substrate is as regular and uniform as possible. This is difficult to achieve.

SUMMARY

It is desirable to provide, for example, a lithographic method and arrangement which obviates or mitigates one or more problems of the prior art, whether identified herein or elsewhere.

According to a first aspect of the invention, there is provided a lithographic method including: providing a first layer of material on a surface of a substrate; exposing a part of the first layer of material to a beam of radiation in order to form a first pattern feature in the first layer of material, the first pattern feature having sidewalls, and a focal property of the beam of radiation being controlled to control a sidewall angle of the sidewalls; providing a second layer of material over the first pattern feature, the second layer of material providing a coating on sidewalls of the first pattern feature; removing a portion of the second layer of material, leaving a coating of the second layer of material on sidewalls of the first pattern feature; removing the first pattern feature formed from the first layer of material, leaving on the substrate at least a part of the second layer of material that formed a coating on sidewalls of that first pattern feature, the part of the second layer of material left on the substrate forming second pattern features in locations adjacent to the locations of sidewalls of the removed first pattern feature.

Controlling of the focal property may control the sidewall angle of the sidewalls of the first pattern feature, thereby affecting a dimension of the coating of the second layer of material on the sidewalls of the first pattern feature. Affecting the dimension of the coating of the second layer of material on the sidewalls of the first pattern feature may result, in turn, in the affecting of a dimension of the at least a part of the second layer of material that is left on the substrate after removal of the first pattern feature.

In addition to controlling a focal property of the beam of radiation, the method may include controlling a dose of radiation provided by the beam of radiation in order to control a sidewall angle of the sidewalls of the first pattern feature. Changing the dose may be achieved by controlling the focal property of the beam of radiation.

Controlling the focal property may be undertaken in response to a measurement of a previously formed second pattern feature, or a spacing between previously formed second pattern features.

The controlling of the focal property for the first pattern feature may be undertaken if the first pattern feature is of a specific type.

The controlling of the focal property for the first pattern feature may be undertaken for one or more specific areas of the substrate, but not for the entire area of the substrate.

Controlling the focal property may include controlling the focal property in a direction that is substantially perpendicular to the surface of the substrate. Controlling the focal property may include moving the focal property away or towards the surface of the substrate. Controlling the focal property may include extending or reducing the focal property in a direction that is substantially perpendicular to the surface of the substrate.

The focal property may be one of: a focal length of an arrangement that provides the beam of radiation, a focal point of the beam of radiation, a depth of focus of the beam of radiation.

The method may include forming a plurality of first pattern features to, in turn, form further second pattern features.

After removing the first pattern feature formed from the first layer of material, leaving on the substrate at least a part of the second layer of material that formed a coating on sidewalls of that first pattern feature, the part of the second layer of material left on the substrate forming second pattern features in locations adjacent to the locations of sidewalls of the removed first pattern feature, the method may include: transferring the second pattern features to the substrate. Transferring the second pattern features to the substrate may be described as providing third pattern features. The third pattern features may correspond in shape, size, configuration, and/or orientation to the second pattern features, as is known in the art.

According to a second aspect of the invention, there is provided a lithographic arrangement including: an illumination system for providing a beam of radiation; a support structure for supporting a patterning device, the patterning device serving to impart the beam of radiation with a pattern in its cross-section; a substrate table for holding a substrate; a projection system for projecting the patterned radiation beam onto a target portion of the substrate; and a controller, wherein in use the lithographic arrangement is used to perform at least a part of the following method: providing a first layer of material on a surface of the substrate; exposing a part of the first layer of material to the beam of radiation in order to form a first pattern feature in the first layer of material, the first pattern feature having sidewalls; providing a second layer of material over the first pattern feature, the second layer of material providing a coating on sidewalls of the first pattern feature; removing a portion of the second layer of material, leaving a coating of the second layer of material on sidewalls of the first pattern feature; removing the first pattern feature formed from the first layer of material, leaving on the substrate at least a part of the second layer of material that formed a coating on sidewalls of that first pattern feature, the part of the second layer of material left on the substrate forming second pattern features in locations adjacent to the locations of sidewalls of the removed first pattern feature, and prior to the lithographic arrangement being used to perform at least a part of the method, the controller is configured to receive information associated with a measurement of a previously formed second pattern feature, or a spacing between previously formed second pattern features, and, during the method, the controller is configured to control at least a part of the lithographic arrangement in order to control the focal property of the beam of radiation to control a sidewall angle of the sidewalls of the first pattern feature.

According to a third aspect of the invention, there is provided at least a part of a device manufactured using the lithographic method or arrangement of the first or second aspect of the invention.

The above aspect have been described in the context of controlling a focal property of a beam of radiation that is used to provide a pattern feature in order to control a sidewall angle of that pattern feature. The control in sidewall angle is used to control, or to have some degree of control, over the dimensions (e.g. line widths) of second pattern features and/or subsequently formed third pattern features. In another aspect, the control of one or more other properties of the beam of radiation may be used to control the sidewall angle of first pattern features formed using the beam of radiation. Alternatively or additionally, any suitable property of the beam of radiation may be controlled to vary a property of the first pattern feature that allows, in turn, some degree of control over the dimensions (e.g. line widths) of second pattern features and subsequently formed third pattern features. For example, any suitable property of the beam of radiation may be controlled to vary a property of a profile of the first pattern feature. The property of the beam of radiation may be something other than a focal property. The property of the first pattern feature may be something other than sidewall angle.

Thus, a fourth aspect of the present invention may be described as a lithographic method including: providing a first layer of material on a surface of a substrate; exposing a part of the first layer of material to a beam of radiation in order to form a first pattern feature in the first layer of material, the first pattern feature having sidewalls, and a property of the beam of radiation being controlled to control a property of the first pattern feature; providing a second layer of material over the first pattern feature, the second layer of material providing a coating on sidewalls of the first pattern feature; removing a portion of the second layer of material, leaving a coating of the second layer of material on sidewalls of the first pattern feature; removing the first pattern feature formed from the first layer of material, leaving on the substrate at least a part of the second layer of material that formed a coating on sidewalls of that first pattern feature, the part of the second layer of material left on the substrate forming second pattern features in locations adjacent to the locations of sidewalls of the removed first pattern feature. The property of the beam of radiation that is controlled should have an affect on a property of the first pattern feature which, in turn has an affect on the dimensions of the subsequently formed second pattern features (and subsequently third pattern features).

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm, or lower) and extreme ultra-violet (EUV) radiation (e.g. having a wavelength in the range of 5-20 nm).

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure or patterning device support holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components to direct shape, or control the beam of radiation, and such components may also be referred to below, collectively or singularly, as a "lens".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

Figure 1:
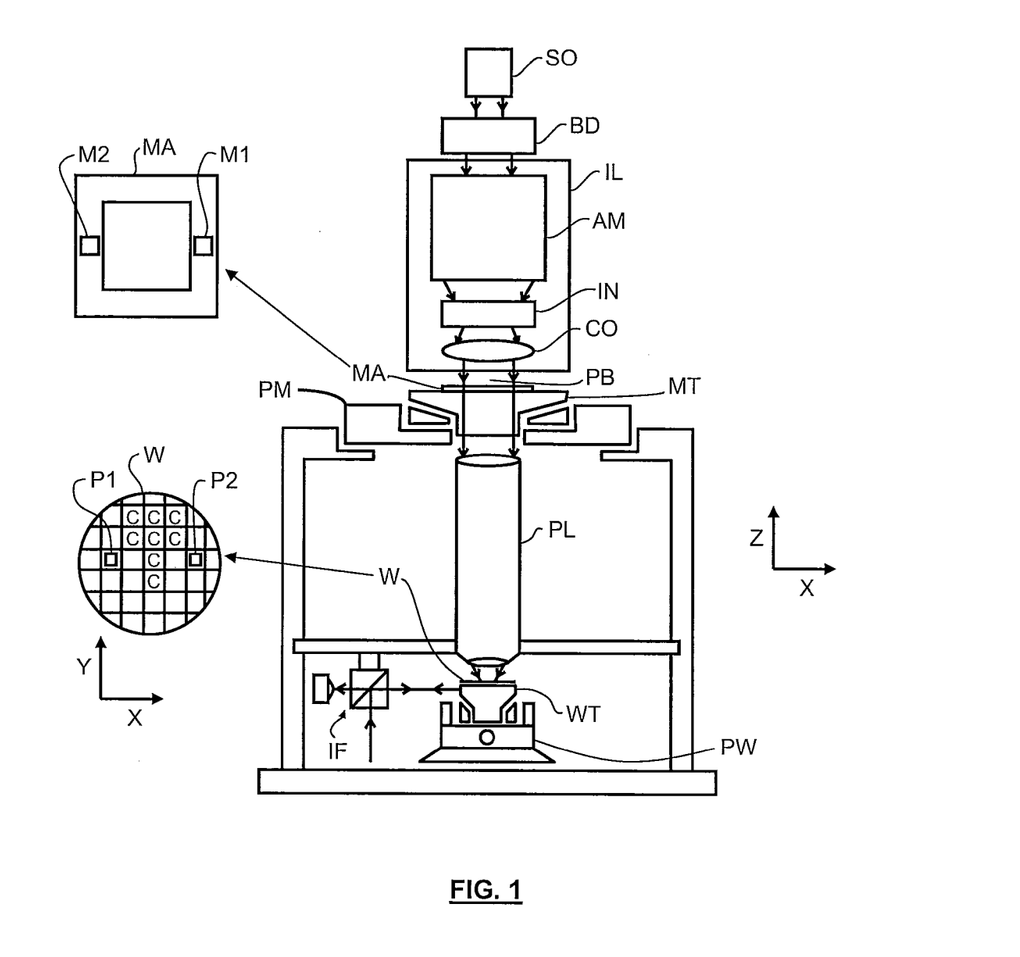
FIG. 1 schematically depicts a lithographic apparatus according to an embodiment of the invention.

FIG. 1 schematically depicts a lithographic apparatus according to a particular embodiment of the invention. The apparatus includes:

an illumination system (illuminator) IL to condition a beam PB of radiation (e.g. UV radiation or EUV radiation).

a support structure or patterning device support (e.g. a support structure) MT to support a patterning device (e.g. a mask) MA and connected to first positioning device PM to accurately position the patterning device with respect to item PL;

a substrate table (e.g. a wafer table) WT to hold a substrate (e.g. a resist-coated wafer) W and connected to second positioning device PW to accurately position the substrate with respect to item PL; and a projection system (e.g. a refractive projection lens) PL configured to image a pattern imparted to the radiation beam PB by patterning device MA onto a target portion C (e.g. including one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may include an adjuster AM to adjust the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally includes various other components, such as an integrator IN and a condenser CO. The illuminator provides a conditioned beam of radiation PB, having a desired uniformity and intensity distribution in its cross-section.

The radiation beam PB is incident on the patterning device (e.g. mask) MA, which is held on the patterning device support MT. Having traversed the patterning device MA, the beam PB passes through the lens PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus can be used in the following preferred modes:

1. In step mode, the patterning device support MT and the substrate table WT are kept essentially stationary, while an entire pattern imparted to the beam PB is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the patterning device support MT and the substrate table WT are scanned synchronously while a pattern imparted to the beam PB is projected onto a target portion C (i.e. a single dynamic exposure). The velocity and direction of the substrate table WT relative to the patterning device support MT is determined by the (de-) magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support MT is kept essentially stationary holding a programmable patterning device, and the substrate table WT is moved or scanned while a pattern imparted to the beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

As discussed above, if a single exposure of a layer of resist is subsequently followed by a development of that resist, the smallest feature size of any pattern formed in that resist is limited by the wavelength of radiation used to form that pattern. If two different exposures are undertaken, the patterns for each exposure being located in-between one another (e.g. interdigitated) the resulting pattern features may be located more closely together than a single exposure and single development of resist would allow. The provision of patterns in this manner, however, is subject to the accurate alignment (e.g. overlay) of the patterns for each exposure. A preferred (or at least alternative) approach may be to use a spacer lithography process which does not have such alignment (or overlay) problems. Such a spacer lithography process is schematically depicted in FIGS. 2a to 2h.

Figure 2A:
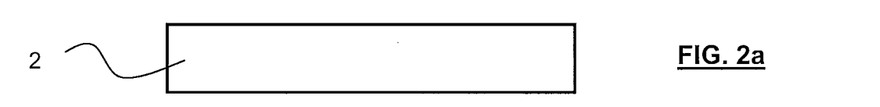
FIGS. 2a to 2h schematically depict an embodiment of a spacer lithography process.
Figure 2B:
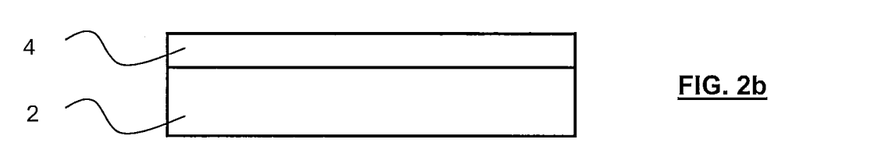
Figure 2C:
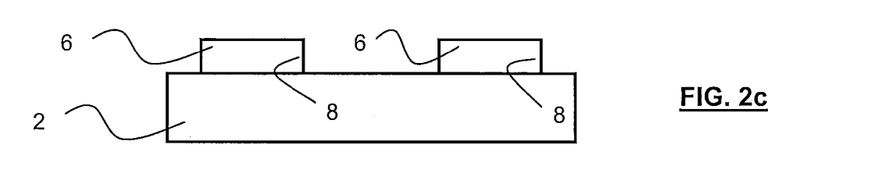

FIG. 2a schematically depicts a substrate. The substrate may be, for example similar or identical to the substrate described in relation to FIG. 1. FIG. 2b schematically depicts the provision of a first layer of material 4 on a surface of the substrate 2. The first layer of material 4 is sometimes referred to as a sacrificial layer, since this layer will be sacrificed (removed) at a later stage during the process. The first layer of material 4 is exposed to a beam of radiation (e.g. a patterned beam of radiation) in order to form first pattern features in the first layer of material 4. The first layer of material 4 is then developed. FIG. 2c shows the first substrate 2 once the first layer has been developed. First pattern features 6 are shown has been located on the substrate 2. The first pattern features 6 have sidewalls 8. The sidewalls 8 extend in a direction which is substantially perpendicular to the surface of the substrate 2.

Figure 2D:
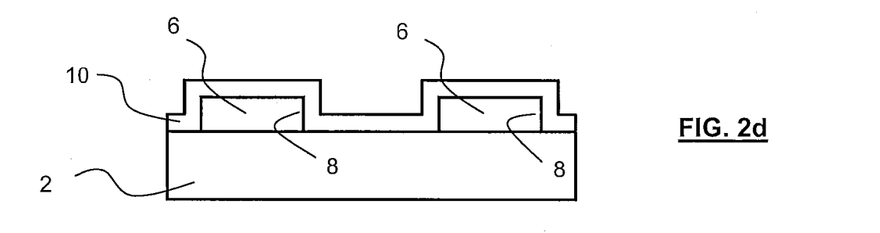

FIG. 2d shows that a second layer of material 10 is provided over the first pattern features 6. The second layer of material 10 coats the sidewalls 8 of the first pattern features 6. The second layer of material 10 is often referred to as a conformal layer, since the second layer of material 10 conforms to the shape of the first pattern features 6.

Figure 2E:
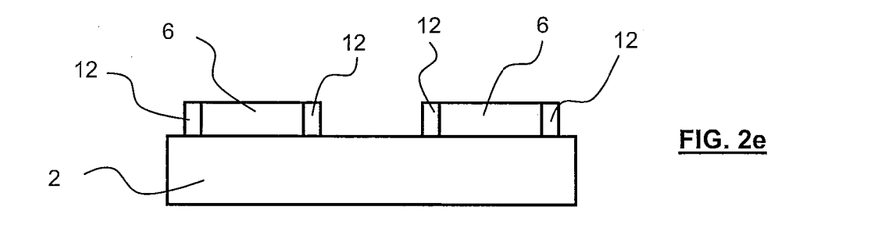

FIG. 2e shows that a portion of the second layer of material is removed, for example by etching or the like. A coating 12 of the second layer of material is left on (e.g. covering or coating) the sidewalls 8 of the first pattern features 6. The coatings 12 of the second layer of material which remain on the sidewalls 8 of the first pattern features 6 are often referred to as spacers, for example in the process that is currently being described—a spacer lithography process. Thus, it is understood that the term "spacer" is used, and may be used throughout this description, to describe the coating of a second layer of material on sidewalls 8 of the first pattern features 6. The first pattern features 6 are then removed, for example by etching or chemical processing or the like.

Figure 2F:
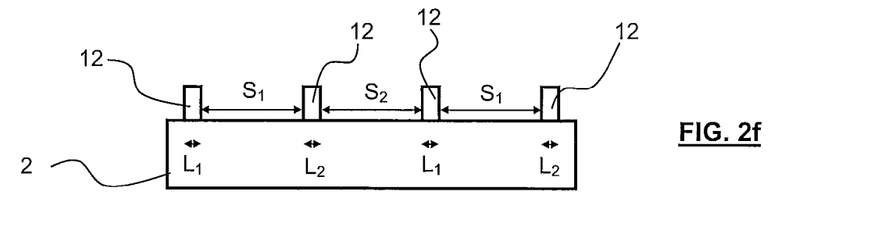

FIG. 2f shows that the first pattern features have been removed. In removing the first pattern features, left on the substrate 2 are at least parts of the second layer of material that formed the coatings 12 on sidewalls of the first pattern features (that have now been removed). This material 12 thus now forms second pattern features 12 on the substrate 2 in locations that are adjacent to the locations of the sidewalls of the removed first pattern features. Hereinafter, the material 12 is referred to as second pattern features 12. From a comparison of FIGS. 2c and 2f it can be seen that the second pattern features 12 of FIG. 2f have half the pitch of the first pattern features 6 of FIG. 2c. This halving in pitch has been achieved not by reducing the wavelength of the radiation used to provide such pattern features, but has instead been achieved by appropriate processing (e.g. the provision and removal of layers) before and after a single exposure.

Referring back to FIG. 2f, various spacings and widths are shown: $S_1$ is a spacing between second pattern features 12 that were formed on sidewalls either side of a single first pattern feature; $S_2$ is a spacing between second pattern features 12 formed adjacent to sidewalls of adjacent and different first pattern features; $L_1$ is the width (or in other words line width) of a second pattern feature 12 formed adjacent to a first side wall of a first pattern feature; $L_2$ is the width (or in other words line width) of a second pattern feature formed adjacent to a second, opposite side wall of the first pattern feature.

In order to create uniformly structured and spaced pattern features it is desirable that $S_1$ is equal to $S_2$, and that $L_1$ is equal to $L_2$. As will be appreciated from a review of FIGS. 2a to 2f and the descriptions thereof, the spacing $S_1$ is primarily determined by the lithographic processes which are associated with the creation of the first pattern feature 6 (see for example FIGS. 2b and 2c). The spacing $S_2$ is also determined by the lithographic processes which are associated with the creation of the first pattern feature 6 (see for example FIGS. 2b and 2c), but also on the provision of the second layer of material 10 (shown in FIG. 2d) and the subsequent removal of a part of that second layer of material 10 (shown in FIG. 2e). The line widths $L_1$ and $L_2$ of the second pattern features 12 are determined by the thickness of the second layer of material 10 that is provided (see for example FIG. 2d) and also on the subsequent removal of the part of the second layer of material 10 (see FIG. 2e). As will be appreciated, it may be difficult to accurately and consistently control all of the processes which go into the determination of the spacings $S_1$ and $S_2$ and $L_1$ and $L_2$, meaning that it may be consequentially difficult to ensure that the second pattern features 12 are equally spaced and have equal widths.

Figure 2G:
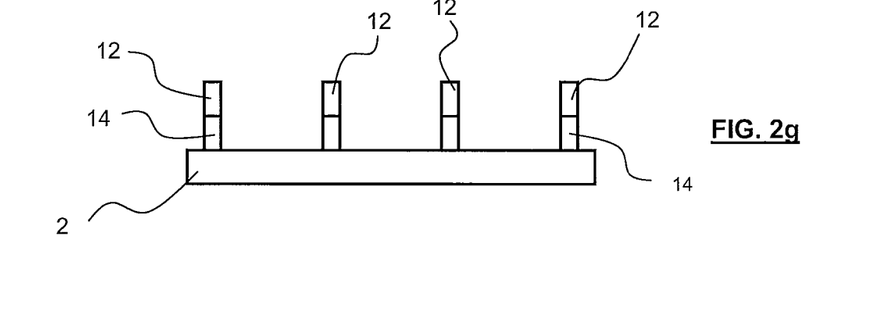
Figure 2H:
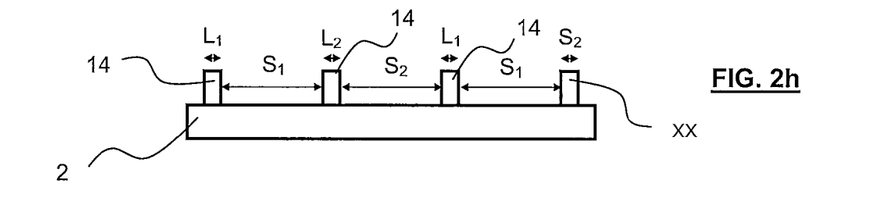

The process shown in FIGS. 2a to 2f may be continued. It is to be understood that the second pattern features shown in FIG. 2f may need to be transferred to the substrate 2. FIG. 2g shows how regions of the substrate 2 which are not shielded by the second pattern features 12 can be removed, for example by etching or the like. Regions shielded by the second pattern features 12 form third pattern features 14, which are formed from the same material as the substrate 2. The second pattern features 12 are then removed, for example by etching or the like. FIG. 2h shows the substrate 2 when the second pattern features have been removed. It can be seen that the third pattern features 14 remain on the substrate 2 and that the line widths $L_1$, $L_2$ of these third pattern features 14, and the spacings between the third pattern features 14 $S_1$, $S_2$ are substantially the same as those shown in and described with reference to FIG. 2f.

Figure 3A:
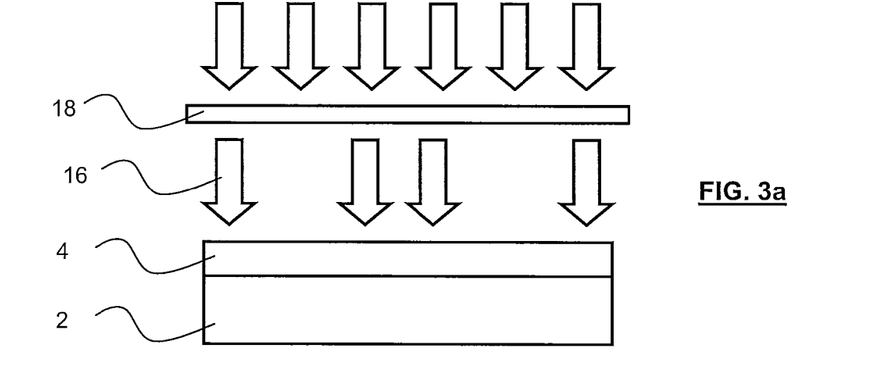
FIGS. 3a and 3b schematically depict exposure principles associated with the process shown in and described with reference to FIGS. 2a to 2h.
Figure 3B:
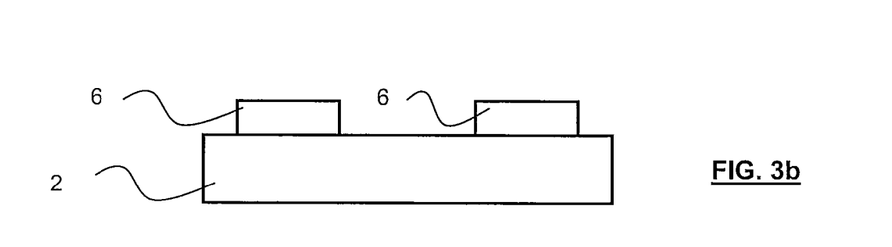

Referring back to FIGS. 2b and 2c, a beam of radiation was described as being used to provide pattern features on a substrate. FIGS. 3a and 3b schematically depict how this may be undertaken. Referring to FIG. 3a, the substrate 2 is shown provided with the first layer of material 4. The first layer of material 4 is exposed to radiation 16 (e.g. UV radiation) which has passed through a patterning device (e.g. a mask) 18 to provide a patterned beam of radiation. It will be appreciates that any appropriate patterning device could be used. Together with subsequent development, the exposure to the beam of radiation 16 can be used to provide first pattern features as described above in relation to FIG. 2c. FIG. 3b shows the first pattern features 6 provided on the substrate 2. When providing the first pattern features 6 it is known to focus the beam of radiation 16 on or within the first layer of material that was used to form the first pattern features 6, or on a plane (relative to the surface of the substrate) where the sensitivity of a critical dimension of the pattern features is least sensitive to changes in focal properties (e.g. the focal point of the beam of radiation). This helps to ensure that the sidewalls 8 of the first patent features 6 are well defined and extend substantially perpendicularly with respect to the surface of the substrate 2.

According to an embodiment of the present invention, a focal property of the beam of radiation that is used to form the first pattern features may be controlled to control a sidewall angle of the sidewalls of the first pattern features. As will be discussed in more detail below, the controlling of the focal property controls the sidewall angle of sidewalls of the first pattern feature, thereby affecting a dimension (e.g. a thickness or the like) of the subsequent coating of a second layer of material formed on the sidewalls of the first pattern feature. This, in turn, results in the effecting of a dimension of the at least a part of a second layer of material that is left on the substrate after removal of the first pattern feature—i.e. the effecting of a dimension (e.g. a line width) of the second pattern features. Thus, according to an embodiment of the present invention, a dimension of the second pattern features can be controlled lithographically, as opposed to, or in conjunction with processing controls (such as layer deposition and layer removal).

An embodiment of the present invention will now be described, by way of example only, with reference to FIGS. 4 to 7.

Figure 4A:
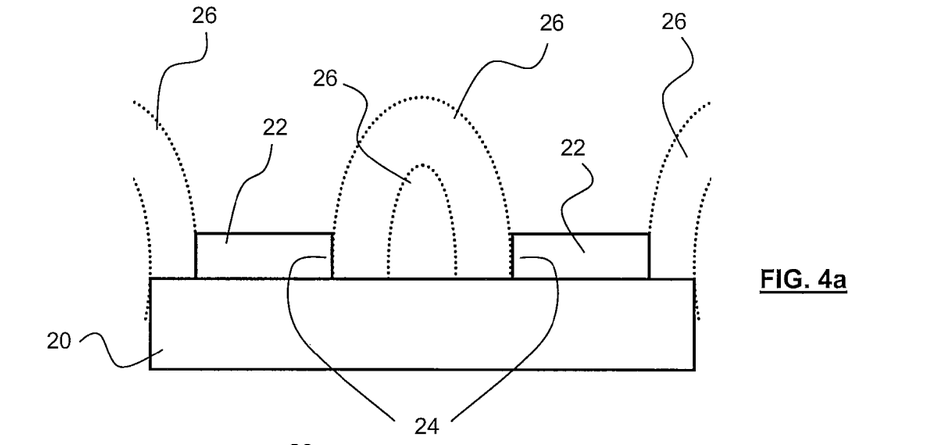
FIGS. 4a to 4c schematically depict effects on the sidewall angles of sidewalls of pattern features in relation to a variation of a focal property of a radiation beam used to provide those pattern features, in accordance with an embodiment of the present invention.

FIG. 4a schematically depicts a substrate 20. A first layer of material has been provided on the substrate 20, exposed to a beam of radiation and developed to form first pattern features 22 (substantially as discussed above in relation to FIGS. 2a to 2c). The first pattern features 22 have sidewalls 24. A representation of portions of the radiation beam which were used to provide the first pattern features 22 is shown by way of contours 26. The contours 26 may represent, for example, an intensity distribution of the beam of radiation (or parts of the beam of radiation) in the vicinity of the areas in which the first pattern features 22 were created (e.g. in-between those features). It is to be appreciated that the contours 26 are given by way of example only, and are only given as basic and diagrammatic aid to assist in the understanding of the present invention. In reality, such contours may be more complex or not in the exact positions depicted in the Figures.

Figure 4B:
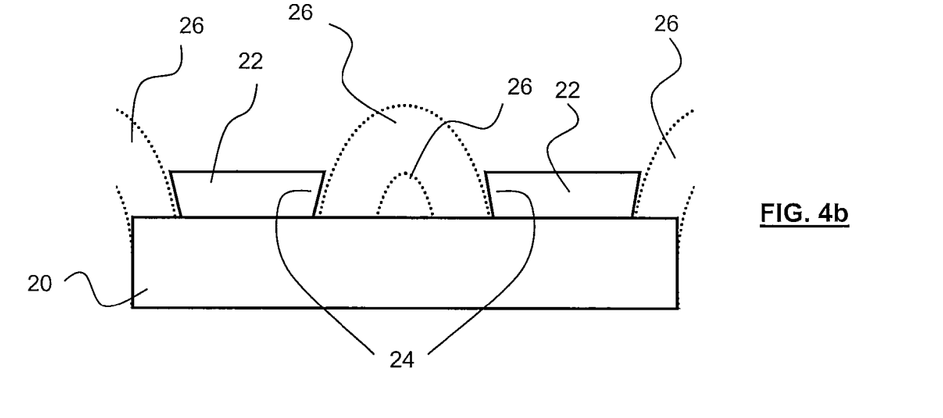
Figure 4C:
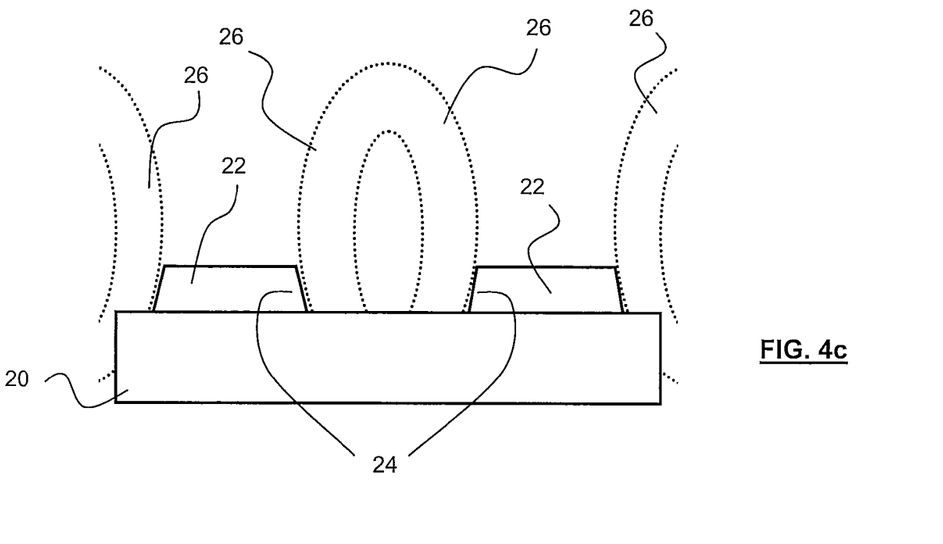

The contours 26 provide a representation of a focal property of the beam of radiation. The focal property may by one of a focal length of the system that provides the beam of radiation, a focal point of the beam of radiation, or a depth of focus of the beam of radiation. The focal property may be controlled by controlling the focal property in a direction that is substantially perpendicular to the surface of the substrate. For instance, the focal property may be moved away or towards the surface of the substrate 20 (e.g. the focal point may be moved), or extended or reduced in a direction that is substantially perpendicular to the surface of the substrate 20 (e.g. the depth of focus may be extended or reduced). In FIGS. 4a to 4c, such control is depicted by the contours 26 moving towards or away from the substrate 20. In other examples (not shown) a change in the focal property (for example a change to the depth of focus) may be represented by an extension or compression of the shape of the contours 26 in a direction substantially perpendicular to the surface of the substrate 20.

Referring back to FIG. 4a, a beam of radiation is focused substantially on the surface of the substrate 20 meaning that the contours 26 are also centered on the surface of the substrate 20. In this embodiment, when the focal point is located in this position, areas of the first layer of material that will eventually form sidewalls 24 on the first pattern features 22 are exposed to substantially equal doses of radiation. This means that the sidewalls 24 are substantially perpendicular with respect to the surface of the substrate 20. This may alternatively or additionally be described as resulting in the sidewall angle of the sidewalls 24 being 90° (if measured from the surface of the substrate 20) or 0° (if measured from a direction substantially perpendicular to the surface of the substrate 20).

FIG. 4b depicts a situation where the focal point of the beam of radiation has been shifted downwards (as shown in the Figure), e.g. towards and/or through a plane defining the surface of the substrate 20. The contours 26 are therefore shown in a lower position in FIG. 4b than the contours 26 shown in FIG. 4a. Referring to FIG. 4b, it can be seen that the sidewall angles of the sidewalls 24 substantially follow the contours 26. In the configuration shown in FIG. 4b, this results in the sidewalls 24 extending away from the substrate 20 and being angled towards the sidewalls 24 of an adjacent first pattern feature 22.

FIG. 4c shows a similar situation to that shown in and described with reference to FIG. 4b. However, in FIG. 4c the focal point of the beam of radiation has been shifted away from the substrate 20, as is depicted by the contours 26 also being shifted away from the substrate 20. The sidewall angles of the sidewalls 24 again substantially follow the contours 26. In FIG. 4c, this results in the sidewalls 24 extending away from the substrate 20 and being angled away from the sidewalls 24 of adjacent first pattern features 22.

It is to be appreciated that the effect of the position of the contours relative to the sidewall angles are given by way of example only, and are only given as basic and diagrammatic aid to assist in the understanding to the present invention. In reality, the relationship between the position of the contours (related to the focal property) and the resultant sidewall angles may be more complex, or not have the direct relationships as depicted in the Figures.

The effect of varying (i.e. controlling) the sidewall angle of the sidewalls is that a dimension (e.g. a thickness) of the second layer of material subsequently formed over the first pattern features is also varied (i.e. controlled). Being able to control a dimension (e.g. a thickness) of the second layer of material subsequently formed over the first pattern features allows for the control of a dimension (e.g. a line width or thickness) of second pattern features formed from the subsequent removal of the first pattern features. This is demonstrated in FIGS. 5a to 5f, which schematically depicts a part of a spacer lithography process.

Figure 5A:
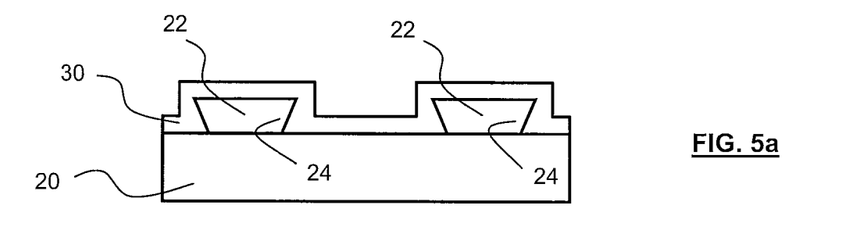
FIGS. 5a to 5g schematically depict a part of a spacer lithography process in accordance with an embodiment of the present invention.

FIG. 5a schematically depicts the substrate 20 and first pattern features 22 of FIG. 4b. The first pattern features 22 may be formed in much the same way as described in relation to FIGS. 2a to 2c, together with the control of the focal property of the beam of radiation used to form the pattern features, as described in relation to FIG. 4b. The sidewalls 24 of the first pattern features 22 extend away from the substrate 20 and are angled towards the sidewalls 24 of an adjacent first pattern feature 22. FIG. 5a also shows that a second layer of material 30 has provided over the first pattern features 22. The second layer of material 30 coats the sidewalls 24 of the first pattern features 22. The second layer of material 10 is often referred to as a conformal layer, since the second layer of material 30 conforms to the shape of the first pattern features 22.

Figure 5B:
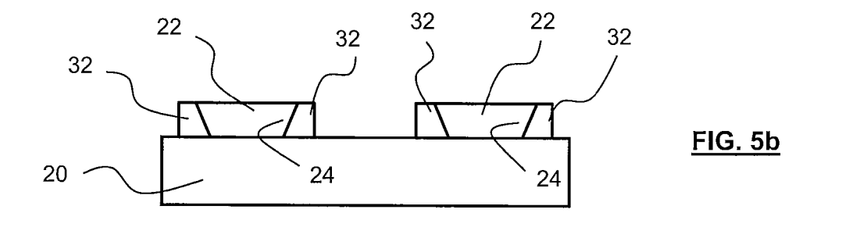

FIG. 5b shows that a portion of the second layer of material is removed, for example by etching or the like. A coating 32 of the second layer of material is left on (e.g. covering or coating) the sidewalls 24 of the first pattern features 22. The coatings 32 of the second layer of material which remain on the sidewalls 24 of the first pattern features 22 are often referred to as spacers, for example in the process that is currently being described—a spacer lithography process. Thus, it is understood that the term "spacer" is used, and may be used throughout this description, to describe the coating of a second layer of material on sidewalls 24 of the first pattern features 22. The first pattern features 22 are then removed, for example by etching or chemical processing or the like.

It can be seen from a comparison of FIG. 5b and FIG. 2d (in which the sidewalls, in contrast to FIG. 5b, are shown as extending perpendicularly away from the substrate) that the coatings of the sidewalls is of a different thickness in FIG. 5b and FIG. 2d. Specifically, the sidewall coatings shown in FIG. 5b are greater than those shown in FIG. 2d. The significance of this difference is described further below.

Figure 5C:
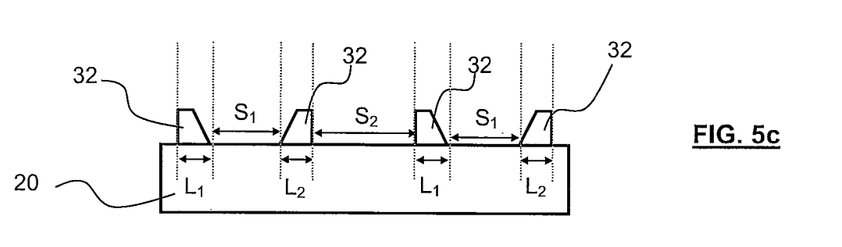

Referring now to FIG. 5c, the first pattern features have been removed. In removing the first pattern features, left on the substrate 20 are at least parts of the second layer of material that formed the coatings 32 on sidewalls of the first pattern features (that have now been removed). This material 32 thus now forms second pattern features 32 on the substrate 20 in locations that are adjacent to the locations of the sidewalls of the removed first pattern features. Hereinafter, the material 32 is referred to as second pattern features 32. From a comparison of FIGS. 4b and 5c it can be seen that the second pattern features 32 of FIG. 5c have half the pitch of the first pattern features 22 of FIG. 4b. This halving in pitch has been achieved not by reducing the wavelength of the radiation used to provide such pattern features, but has instead been achieved by appropriate processing (e.g. the provision and removal of layers) before and after a single exposure.

Referring back to FIG. 5c, various spacings and widths are shown: $S_1$ is a spacing between second pattern features 32 that were formed on sidewalls either side of a single first pattern feature; $S_2$ is a spacing between second pattern features 32 formed adjacent to sidewalls of adjacent and different first pattern features; $L_1$ is the width (or in other words line width) of a second pattern feature 12 formed adjacent to a first side wall of a first pattern feature; $L_2$ is the width (or in other words line width) of a second pattern feature formed adjacent to a second, opposite side wall of the first pattern feature.

Figure 5D:
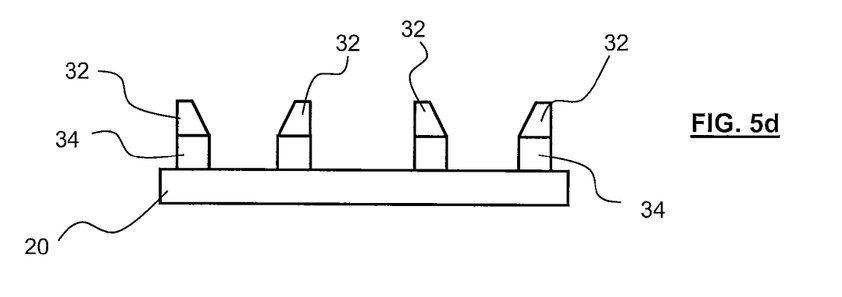
Figure 5E:
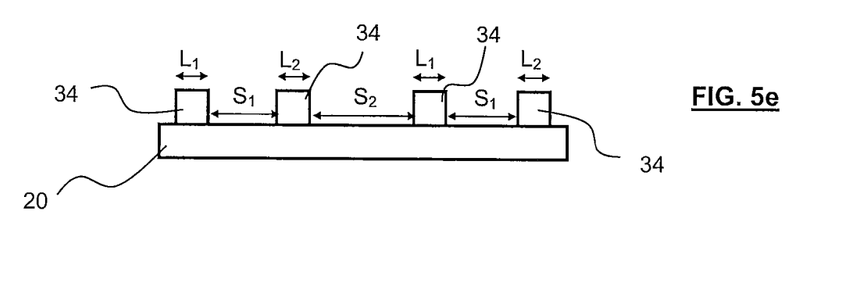

The process shown in FIGS. 5a to 5c may be continued. It is to be understood that the second pattern features 32 shown in FIG. 5c may need to be transferred to the substrate 20. FIG. 5d shows how regions of the substrate 20 which are not shielded by the second pattern features 32 can be removed, for example by etching or the like. Regions shielded by the second pattern features 32 form third pattern features 34, which are formed from the same material as the substrate 20. The second pattern features 32 are then removed, for example by etching or the like. FIG. 5e shows the substrate 20 when the second pattern features have been removed. It can be seen that the third pattern features 34 remain on the substrate 20 and that the line widths $L_1$, $L_2$ of these third pattern features 34, and the spacings between the third pattern features 34 $S_1$, $S_2$ are substantially the same as those shown in and described with reference to FIG. 5c.

Figure 5F:
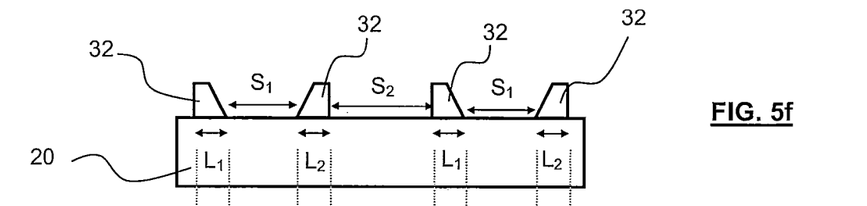
Figure 5G:
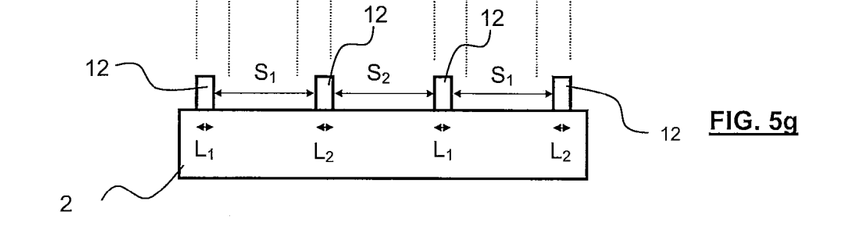

FIG. 5f is the same as FIG. 5c, discussed above, and is shown again for comparative reasons. FIG. 5g is the same as FIG. 2f. In summary, FIG. 5g shows second pattern features 12 provided on a substrate 2, wherein the second pattern features 12 were formed by forming coatings on sidewalls of first pattern features that extended substantially perpendicularly away from the substrate 2. FIGS. 5f and 5g are now compared. In FIG. 5f, the second pattern features 32 formed when the sidewalls of the first pattern features did not extend perpendicularly away from the substrate 20, but were instead angled away from the perpendicular (see, for example, FIG. 5b) are thicker (e.g. have a greater line width) than in FIG. 5g, where the second pattern features 12 formed by coating the sidewalls of first pattern features that extended substantially perpendicularly away from the substrate (see, for example, FIG. 2e). It will thus be appreciated that varying a focal property of a beam of radiation used to form first pattern features on a substrate can be used to affect the sidewall angles of sidewalls of those first pattern features. Subsequently, variation in those sidewall angles can be used to control line widths of second pattern features formed by coating of those sidewalls, followed by removal of the first pattern features. In summary, the variation in the focal property of the beam of radiation used to provide first pattern features can be used to control a dimension (e.g. a line width) of second pattern features formed using first pattern features, for example sidewalls of those first pattern features.

Figure 6:
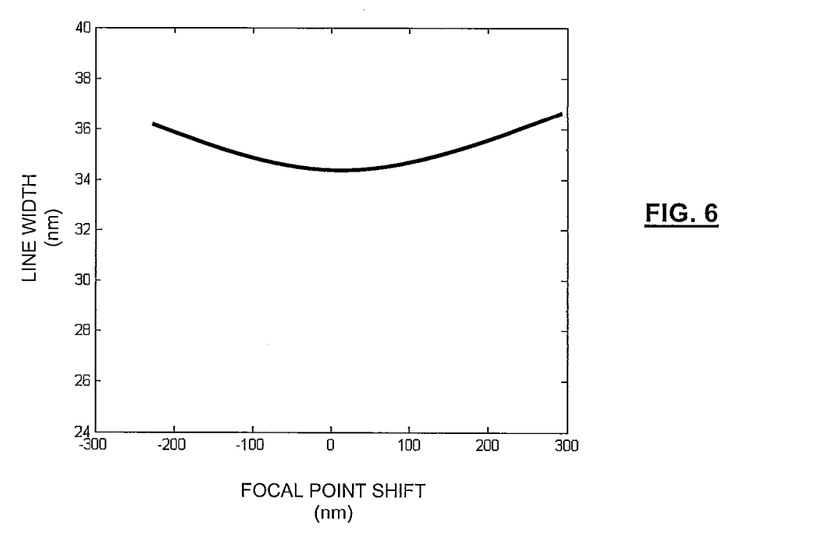
FIG. 6 is a graph schematically depicting a relationship between a shift in the focal point a beam of radiation used to provide first pattern features, and the line width of second pattern features formed using those first pattern features, in accordance with an embodiment of the present invention.

A benefit of controlling a focal property of a beam of radiation to, in turn, control a line width of second pattern features is that the change in the focal property can be locally applied to pattern features of a first type (for example to form densely packed regular lines, lines of a certain pitch, lines of a certain line width, and the like) or applied to one or more specific areas of the substrate (for example in which densely packed regular lines are to be formed). This is contrast with a processing method such as etching or developing, which is usually applied to the entire substrate (i.e. globally applied). A further benefit is that the focal property can be accurately controlled by, for example, appropriate control of properties of a lithographic apparatus (e.g. an illuminator or a projection lens, projection system, or the like), and that accurate control can be accurately applied across different areas of the substrate (by, for example, appropriate accurate control of the movement of the substrate or the beam of radiation, or both). For example, such control can be applied so that the focal property is different for different dies, target portions or exposure fields, or the like. FIG. 6 is a graph schematically depicting a relationship between the shift in focal point of a beam of radiation (from a nominal value, for example when the focal point coincides with a surface of the substrate, or a surface of the first layer of material) and the resulting line width of second (or third) pattern features formed in accordance with an embodiment of the present invention. A shift in the focal point of 200 nm toward or away from the substrate can be used to achieve a 2 nm change in the line width of the second pattern features. A 100 nm shift in the focal point can be used to affect a 1nm change in the line width of the resultant second pattern features. In summary, the graph demonstrates that the line width can be accurately controlled by appropriate accurate control of the focal point shift.

In addition to controlling the focal property of the beam of radiation used to provide the first pattern features, from which second pattern features are subsequently formed, the dose of radiation may also be controlled. Controlling the dose of radiation may also be used to control a sidewall angle of the sidewalls of the first pattern feature, thereby allowing further control of a dimension (e.g. a line width) of the subsequently formed second pattern features. Changing the dose may be achieved by controlling the focal property of the beam of radiation.

Controlling the focal property of the beam of radiation may be undertaken in response to a measurement of a previously formed second pattern feature (e.g. a dimension thereof), or a space in between previously formed second pattern features (e.g. $S_1$, $S_2$, $L_1$, $L_2$, described above). Such measurements can be processed to determine whether a dimension of the second pattern features (e.g. a line width, $L_1$, $L_2$) needs to be changed, for example increased or decreased. If such increase or decrease is required a focal property of the beam of radiation may be controlled to control a sidewall angle of the sidewalls of the first pattern feature, as discussed above. Such control may be undertaken when forming first pattern features on the same substrate on which measurement was undertaken, or on a different substrate.

Figure 7:
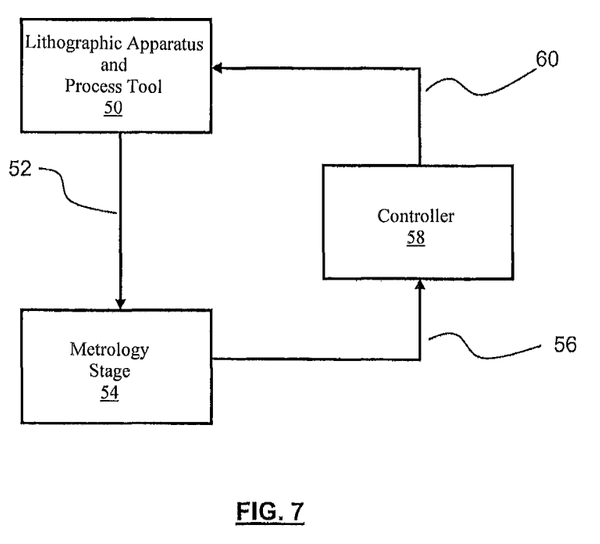
FIG. 7 schematically depicts a flow chart representing how a focal property of a radiation beam may be controlled, in accordance with an embodiment of the present invention.

FIG. 7 schematically depicts a flow chart depicting how a measurement can be used to control a focal property of a beam of radiation to, in turn, control the sidewall angle of first pattern features formed using that beam of radiation. A lithographic apparatus and process (e.g. etch) tool is schematically depicted by box 50. A spacer lithography process may be undertaken using the lithographic apparatus and process tool 50 to perform the method shown in and described with reference to FIGS. 5a to 5f. A substrate having resultant second pattern features may then be transferred (depicted by arrow 52) to a metrology (e.g. measurement) stage 54. At this metrology stage 54, various measurements may be taken, for example the spacings $S_1$, $S_2$, or line widths $L_1$, $L_2$ discussed above. Information regarding this measurements is then sent (depicted by arrow 56) to a controller depicted by box 58. The controller 58 is configured to receive this information 56. The information 56 is associated with, or equates to, the measurement of a previously formed second pattern feature, or a spacing between previously formed second pattern features. The controller 58 is also configured to control (depicted by arrow 60) at least a part of a lithographic apparatus (e.g. a part of the illuminator or of the projection system) in order to control the focal property of the beam of radiation to, in a subsequent exposure, control a sidewall angle of the sidewalls of the first pattern features.

The controller referred to in FIG. 7 may form part of a lithographic arrangement. The lithographic arrangement may include: an illumination system for providing a beam of radiation; a support structure for supporting a patterning device, the patterning device serving to impart the beam of radiation with a pattern in its cross-section; a substrate table for holding a substrate; a projection system for projecting the patterned beam of radiation onto a target portion of the substrate; and the controller. The lithographic arrangement could thus be described as including a lithographic apparatus (for example that shown in FIG. 1) and a controller for at least a part of that arrangement. In use, the lithographic arrangement is used to perform at least a part of the method described above, which in summary includes: providing a first layer of material on a surface of the substrate; exposing a part of the first layer of material to the beam of radiation in order to form a first pattern feature in the first layer of material, the first pattern feature having sidewalls; providing a second layer of material over the first pattern feature, the second layer of material providing a coating on sidewalls of the first pattern feature; removing a portion of the second layer of material, leaving a coating of the second layer of material on sidewalls of the first pattern feature (e.g. to form one or more spacers, as described above); removing the first pattern feature formed from the first layer of material, leaving on the substrate at least a part of the second layer of material that formed a coating on the sidewalls of that first pattern feature, the part of a second layer of material left on the substrate forming second pattern features (i.e. spacers) in locations adjacent to the locations of sidewalls of the removed first pattern feature. Prior to the method, the controller may be configured to receive information associated with a measurement of a dimension of a previously formed second pattern feature, or a spacing between previously formed second pattern features, and during the method, the controller is configured to control at least a part of the lithographic arrangement (for example a part of the illuminator or projection system) in order to control the focal property of the beam of radiation to, in turn, control a sidewall angle of the sidewalls of the first pattern feature (and thus, for example, the line width of second pattern features subsequently formed using the first pattern features).

The controller may be any suitable arrangement that is able to control, for example, a part of the lithographic arrangement. For example, the controller may be a computer, or an embedded processor, or code for use in such a computer or processor.

In the above description, reference has been made to second pattern features. For instance, it has been described that controlling the focal property of the beam of radiation may be undertaken in response to a measurement of a previously formed second pattern feature (e.g. a dimension thereof), or a space in between previously formed second pattern features (e.g. $S_1$, $S_2$, $L_1$, $L_2$, described above). Alternatively or additionally, controlling the focal property of the beam of radiation may be undertaken in response to a measurement of a previously formed third pattern feature (e.g. a dimension thereof), or a space in between previously formed third pattern features (e.g. $S_1$, $S_2$, $L_1$, $L_2$, described above), the third pattern features being formed as described above (e.g. from and/or using second pattern features). The measurement may be undertaken on the same substrate, or a different substrate onto which a beam of radiation is to be projected to provide first pattern features in accordance with embodiments of the present invention.

It will be appreciated from the description of embodiments of the invention that embodiments of the invention are particularly applicable to nanometer scale lithography, wherein one or more dimensions (e.g. line widths or critical dimensions) of pattern features (e.g. the first, second or third pattern features described above) are of the order of nanometers.

Due to the manner in which first pattern features are coated with a second layer of material, it is common for a dimension (e.g. a line width) of the first pattern feature to be greater than a dimension (e.g. a thickness) of the second layer of material, and thus greater than a dimension (e.g. a line width) of second pattern features from using that second layer of material.

It will be appreciated that the formation of second (and/or third) pattern features in accordance with an embodiment of the present invention may be used in the manufacture of part or all of a device. Therefore, in accordance with an embodiment of the present invention there is provided at least a part of a device manufactured using methods or arrangements in accordance with embodiments of the present invention, as discussed above.

The above embodiments have been described in the context of controlling a focal property of a beam of radiation that is used to provide a pattern feature in order to control a sidewall angle of that pattern feature. The control in sidewall angle is used to control, or to have some degree of control, over the dimensions (e.g. line widths) of second pattern features and subsequently formed third pattern features. In another embodiment, the control of one or more other properties of the beam of radiation may be used to control the sidewall angle of first pattern features formed using the beam of radiation. Alternatively or additionally, any suitable property of the beam of radiation may be controlled to vary a property of the first pattern feature that allows, in turn, some degree of control over the dimensions (e.g. line widths) of second pattern features and subsequently formed third pattern features. The property of the beam of radiation may be something other than a focal property. The property of the first pattern feature may be something other than sidewall angle.

While specific embodiments of the invention have been described above, it will be appreciated that the invention may be practiced otherwise than as described. The description is not intended to limit the invention.

The invention claimed is:

1. A lithographic method comprising:
   providing a first layer of material on a surface of a substrate;
   exposing a part of the first layer of material to a beam of radiation in order to form a first pattern feature in the first layer of material, the first pattern feature having sidewalls;
   providing a second layer of material over the first pattern feature, the second layer of material providing a coating on sidewalls of the first pattern feature;
   removing a portion of the second layer of material, leaving a coating of the second layer of material on sidewalls of the first pattern feature;
   removing the first pattern feature formed from the first layer of material, leaving on the substrate at least a part of the second layer of material that formed a coating on sidewalls of that first pattern feature, the part of the second layer of material left on the substrate forming second pattern features in locations adjacent to the locations of sidewalls of the removed first pattern feature, and
   adjusting a distance between two adjacent second pattern features respectively formed on two adjacent first pattern features by controlling a focal property of the beam of radiation during exposure of the first layer of material so as to control a sidewall angle of said sidewalls, thereby affecting a dimension of the coating of the second layer of material on the sidewalls of the first pattern feature.

2. The method of claim 1, wherein affecting the dimension of the coating of the second layer of material on the sidewalls of the first pattern feature results, in turn, in the affecting of a dimension of the at least a part of the second layer of material that is left on the substrate after removal of the first pattern feature.

3. The method of claim 1, wherein, in addition to controlling a focal property of the beam of radiation, controlling a dose of radiation provided by the beam of radiation in order to control the sidewall angle of the sidewalls of the first pattern feature.

4. The method of claim 1, wherein controlling the focal property is undertaken in response to a measurement of a previously formed second pattern feature, or a spacing between previously formed second pattern features.

5. The method of claim 1, wherein the controlling of the focal property for the first pattern feature is undertaken if the first pattern feature is of a specific type.

6. The method of claim 1, wherein the controlling of the focal property for the first pattern feature is undertaken for one or more specific areas of the substrate, but not for the entire area of the substrate.

7. The method of claim 1, wherein controlling the focal property comprises controlling the focal property in a direction that is substantially perpendicular to the surface of the substrate.

8. The method of claim 7, wherein controlling the focal property comprises moving the focal property away or towards the surface of the substrate.

9. The method of claim 7, wherein controlling the focal property comprises extending or reducing the focal property in a direction that is substantially perpendicular to the surface of the substrate.

10. The method of claim 1, wherein the focal property is one of: a focal length of an arrangement that provides the beam of radiation, a focal point of the beam of radiation, a depth of focus of the beam of radiation.

11. The method of claim 1, comprising forming a plurality of first pattern features to, in turn, form further second pattern features.

12. The method of claim 1, wherein after:
removing the first pattern feature formed from the first layer of material, leaving on the substrate at least a part of the second layer of material that formed a coating on sidewalls of that first pattern feature, the part of the second layer of material left on the substrate forming second pattern features in locations adjacent to the locations of sidewalls of the removed first pattern feature,
the method comprises:
transferring the second pattern features to the substrate.

13. A device manufactured using the lithographic method as claimed in claim 1.

14. The method of claim 1, wherein prior to exposing the part of the first layer of material to the beam of radiation, the method comprises receiving information associated with a measurement of a previously formed second pattern feature, or a spacing between previously formed second pattern features to control the focal property of the beam of radiation to control a sidewall angle of the sidewalls.

15. A lithographic arrangement comprising:
an illumination system configured to provide a beam of radiation;
a support constructed to support a patterning device, the patterning device serving to impart the beam of radiation with a pattern in its cross-section;
a substrate table configured to hold a substrate;
a projection system configured to project the patterned radiation beam onto a target portion of the substrate; and
a controller,
wherein the lithographic arrangement is constructed and arranged to:
provide a first layer of material on a surface of the substrate;
expose a part of the first layer of material to the beam of radiation in order to form a first pattern feature in the first layer of material, the first pattern feature having sidewalls;
provide a second layer of material over the first pattern feature, the second layer of material providing a coating on sidewalls of the first pattern feature;
remove a portion of the second layer of material, leaving a coating of the second layer of material on sidewalls of the first pattern feature;
remove the first pattern feature formed from the first layer of material, leaving on the substrate at least a part of the second layer of material that formed a coating on sidewalls of that first pattern feature, the part of the second layer of material left on the substrate forming second pattern features in locations adjacent to the locations of sidewalls of the removed first pattern feature,
wherein the controller is configured to receive information associated with a measurement of a previously formed second pattern feature, or a spacing between previously formed second pattern features, and, wherein the controller is configured to control at least a part of the lithographic arrangement in order to control the focal property of the beam of radiation to control a sidewall angle of the sidewalls of the first pattern feature to adjust a distance between two adjacent second pattern features respectively formed on two adjacent first pattern features, thereby affecting a dimension of the coating of the second layer of material on the sidewalls of the first pattern feature.

16. A non-transitory computer readable medium encoded with instructions for performing a lithographic method comprising:
providing a first layer of material on a surface of a substrate;
exposing a part of the first layer of material to a beam of radiation in order to form a first pattern feature in the first layer of material, the first pattern feature having sidewalls;
providing a second layer of material over the first pattern feature, the second layer of material providing a coating on sidewalls of the first pattern feature;
removing a portion of the second layer of material, leaving a coating of the second layer of material on sidewalls of the first pattern feature;
removing the first pattern feature formed from the first layer of material, leaving on the substrate at least a part of the second layer of material that formed a coating on sidewalls of that first pattern feature, the part of the second layer of material left on the substrate forming second pattern features in locations adjacent to the locations of sidewalls of the removed first pattern feature, and
adjusting a distance between two adjacent second pattern features respectively formed on two adjacent first pattern features by controlling a focal property of the beam of radiation during exposure of the first layer of material so as to control a sidewall angle of said sidewalls, thereby affecting a dimension of the coating of the second layer of material on the sidewalls of the first pattern feature.

17. The non-transitory computer readable medium of claim 16, wherein the method comprises moving the focal property away or towards the surface of the substrate.

18. A processor of a lithographic arrangement arranged to perform a lithographic method, the processor comprising:

software code for providing a first layer of material on a surface of a substrate;

software code for exposing a part of the first layer of material to a beam of radiation in order to form a first pattern feature in the first layer of material, the first pattern feature having sidewalls;

software code for providing a second layer of material over the first pattern feature, the second layer of material providing a coating on sidewalls of the first pattern feature;

software code for removing a portion of the second layer of material, leaving a coating of the second layer of material on sidewalls of the first pattern feature;

software code for removing the first pattern feature formed from the first layer of material, leaving on the substrate at least a part of the second layer of material that formed a coating on sidewalls of that first pattern feature, the part of the second layer of material left on the substrate forming second pattern features in locations adjacent to the locations of sidewalls of the removed first pattern feature, and software code for adjusting a distance between two adjacent second pattern features respectively formed on two adjacent first pattern features by controlling a focal property of the beam of radiation during exposure of the first layer of material so as to control a sidewall angle of said sidewalls, thereby affecting a dimension of the coating of the second layer of material on the sidewalls of the first pattern feature.

* * * * *